(12) United States Patent
Ganton

(10) Patent No.: US 7,051,169 B2
(45) Date of Patent: May 23, 2006

(54) MEMORY CONFIGURATION FOR A WIRELESS COMMUNICATIONS DEVICE

(75) Inventor: Robert Bruce Ganton, San Diego, CA (US)

(73) Assignee: Kyocera Wireless Corp., San Diego, CA (US)

(*) Notice: Subject to any disclaimer, the term of this patent is extended or adjusted under 35 U.S.C. 154(b) by 252 days.

(21) Appl. No.: 10/085,773

(22) Filed: Feb. 26, 2002

(65) Prior Publication Data
US 2003/0163656 A1 Aug. 28, 2003

(51) Int. Cl.
*G06F 12/00* (2006.01)
(52) U.S. Cl. .................. 711/154; 455/418; 455/90.1
(58) Field of Classification Search ................ 711/104, 711/105, 154; 455/550.1, 418–420, 9
See application file for complete search history.

(56) References Cited

U.S. PATENT DOCUMENTS

| | | | |
|---|---|---|---|
| 6,400,725 B1 * | 6/2002 | Ross | 370/445 |
| 2002/0032843 A1 * | 3/2002 | Lofgren et al. | 711/154 |
| 2003/0050087 A1 * | 3/2003 | Kwon | 455/550 |

FOREIGN PATENT DOCUMENTS

EP    1 189 465 A1 *   3/2002

* cited by examiner

*Primary Examiner*—Matthew M. Kim
*Assistant Examiner*—Hetul Patel

(57) ABSTRACT

The present invention provides a method and system that uses serial, writable, nonvolatile memory (serial memory) in a portable radio telephone. According to an object of the present invention, the serial memory may be integral to a cell phone or attached to a cell phone via an add-on card or the like. According to another object, the serial memory may be embedded in a cell phone accessory or attached to an accessory via an add-on card or the like. In both objects, once the portable radio telephone is powered on, data stored in serial memory is transferred into onboard random access memory (RAM), which in turn is utilized by the CPU and/or other cell phone systems. Serial memory includes, but is not limited to, NAND-type flash memory, as well as, flash and EEPROM memories that utilize the following interface architectures: the mircowire bus, the $I^2C$ bus, the SPI bus and/or the MPS bus. Among other things, serial memory may store the operating system, applications, and radio calibration parameters.

20 Claims, 8 Drawing Sheets

MEMORY CONFIGURATION FOR A WIRELESS COMMUNICATIONS DEVICE

BACKGROUND OF THE INVENTION

1. Field of the Invention

The present invention is directed to electronics. The present invention further relates to memory for a wireless communications device.

2. Description of Related Art

On a complexity per cubic inch scale, cellular telephones are some of the most intricate devices people use on a daily basis. Modem digital cellular telephones can process millions of calculations per second in order to compress and decompress the voice stream. FIG. 7 shows a block diagram of a conventional portable radio telephone 10 (a.k.a. cell phone, cellular phone, mobile phone, wireless phone, etc.). The cell phone 10 includes an antenna 12 coupled to a transmitter 14 a receiver 16, as well as, a microphone 18, speaker 20, keypad 22, and display 24. The cell phone 10 also includes a power supply 26 and a central processing unit (CPU) 28, which may be an embedded controller, conventional microprocessor, or the like. In addition, the cell phone 10 includes integrated, NOR-type flash memory 30. NOR-type flash memory will be defined below with reference to FIG. 8.

Flash memory, in general, is a type of electrically erasable programmable read only memory (EEPROM). Like EEPROM, flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but must be erased on a block basis. Although standard EEPROMs may appear to be more versatile, their functionality requires two transistors to hold one bit of data. In flash memory, only one transistor is required to hold one bit of data, which results in a lower cost per bit.

In flash memory, the basic storage cell is a MOSFET transistor with a floating gate that is electrically isolated between the control gate and the MOSFET channel. A cell is programmed by transferring an electric charge to the floating gate (e.g. by channel hot electron injection) and erased by removing the charge (e.g. by Fowler-Nordheim tunneling). The floating gate is in close physical proximity to the MOSFET channel so that even a small electric charge on the floating gate has an easily detectable effect on the electrical behavior of the transistor. By applying appropriate signals to the MOSFET terminals and measuring the change in the transistor behavior, it is possible to determine whether or not there is an electric charge on the floating gate. The charge on the gate is then compared with a threshold value and each cell is characterized as "1" or "0".

Flash memory comes in two primary varieties, NOR-type flash and NAND-type flash. While the general memory storage transistor is the same for all flash memory, it is the interconnection of the memory cells that differentiates the designs. FIG. 8A shows the conventional NOR-type cell architecture and FIG. 8B shows the conventional NAND-type cell architecture. In NOR-type flash memory, the memory cell transistors are connected to the bit lines in a parallel configuration, while in NAND-type flash memory, the memory cell transistors are connected to the bit lines in series. This is why NOR-type flash is sometimes referred to as "parallel flash" and NAND-type flash is referred to as "serial flash."

Traditionally, cell phone CPUs have needed only a small amount of integrated NOR-type flash memory to operate. However, as cell phones have become more complex, offering more features and more services, memory requirements have steadily increased. Unfortunately, contrary to the normal trend for memory devices, such as dynamic random access memory (DRAM), NOR-type flash memory pricing has increased at a rate beyond the pro rata increases in capacity for such devices.

By far, NOR-type flash memory is the dominant type of flash memory in the market today. NOR-type flash memory has fast random read speeds, making the NOR architecture suitable for the fast random access required for program execution. In addition, the interface to NOR-type flash memory is designed for direct memory access, having separate address, data, and control lines. This enables a direct connection to microprocessors and permits direct execution of program code. For these reasons, manufactures have chosen to utilize NOR-type flash memory in prior art cell phones to execute program code, applications and the like. NAND-type flash memory, on the other hand, has relatively slow random read speeds compared to NOR-type flash memory, but fast erase and program speeds. In addition, the interface to NAND-type flash memory is indirect so there are no dedicated address lines or data lines, just control lines and I/O ports. This makes NAND-type flash memory relatively unsuitable for direct CPU access and execution of program code, but ideal as a mass storage device.

The current telecommunications market, especially the market for cell phones is extremely competitive. Consumers have many choices. While cell phone feature sets and services can distinguish one phone from the next, price is still an ultimate concern for a vast majority of users. To remain competitive in this market, manufacturers are constantly striving to build lower cost cell phones. Increases in NOR-type flash memory pricing, however, have made it difficult for manufacturers to achieve this goal. Any economies that can be gained in cell phone manufacture would be significant in this tight market.

BRIEF SUMMARY OF THE INVENTION

The present invention overcomes the perceived deficiencies with NAND-type flash memory and the dependence on NOR-type flash memory in wireless communication devices. A method and system is provided that uses non-addressable or indexed addressable memory or addressable memory that uses a serial interface. The indexed addressable memory is preferably parallel. In another embodiment, however, the indexed memory uses serial data or serial addressing or both.

According to an object of the present invention, the serial memory may be integral to a cell phone or attached to a cell phone via an add-on card or the like. According to another object, the serial memory may be embedded in a cell phone accessory or attached to an accessory via an add-on card or the like. In both objects, once the portable radio telephone is powered on, data stored in serial memory is transferred into onboard random access memory (RAM), which in turn is utilized by the CPU and/or other cell phone systems.

The increase of NOR-type flash memory prices and the effect of those prices on overall cell phone manufacturing costs have prompted the need for alternative memory configurations. The dependence of prior art cell phones on integrated, NOR-type flash memory forces manufactures to comply with ever increasing memory prices and prevents manufacturers from offering cell phones at more economical prices. By replacing the expensive integral, NOR-type flash memory with serial memory, as described herein, manufacturers will be able to achieve significant cost reductions ultimately leading to less costly cell phones for consumers.

Other objects, advantages, and embodiments of the invention are set forth in part in the description that follows, and in part, will be obvious from this description, or may be learned from the practice of the invention.

BRIEF DESCRIPTION OF THE DRAWINGS

The foregoing and other objects, features and advantages of this invention will become more apparent by reference to the following detailed description of the invention taken in conjunction with the accompanying drawings, wherein.

DETAILED DESCRIPTION OF THE INVENTION

As stated above, while serial memory is not well suited for direct CPU access and direct execution of program code, it is ideally suited as an inexpensive storage vehicle for, among other things, operating systems, program code, applications, radio calibration parameters and phonebooks. The present invention takes advantage of the strengths of serial memory and utilizes them in an alternative memory configuration for use with a portable radio telephone. In the following discussion several examples will be given that use serial memory. Serial memory is used to illustrate the concepts, however it will be clear to one skilled in the art that other types of memory can be used.

Devices that are addressable, but use serial data, serial address, or a combination of the two can also be used. Serial data, serial address, or a combination of the two would be used when a memory device that is extremely input/output limited is selected. It will be clear to one of skill in the art that the input/output pin limitation may be on devices with a high number of input/output pins, but where a large number of pins are needed to perform other functions of the device. Clocked serial memory, clocked parallel memory, indexed addressable memory, and addressable devices that use some form of serial interface as described above will be referred to as indirectly-read memory. It will be clear to one of skill in the art that the indirectly-read memory may be writeable, one-time writable, electrically erasable, ultraviolet light erasable, erased by a means other than electrically or ultraviolet light, programmable by the user, programmable at the factory, or a ROM memory that is not programmable. This list is not meant to be exhaustive.

As embodied and broadly described herein, the present invention is directed to a novel method and system for using serial, writable, nonvolatile memory (serial memory) with a portable radio telephone. Serial memory includes, but is not limited to, NAND-type flash memory, as well as, flash and EEPROM memories that utilize the following interface architectures: the mircowire bus, the $I^2C$ bus, the SPI bus and/or the MPS bus. Specific examples of serial memory include, but are not limited to, MultiMediaCard, Memory Stick, SmartMedia card, and SD (Secure Digital) Memory Card.

Figure 1:
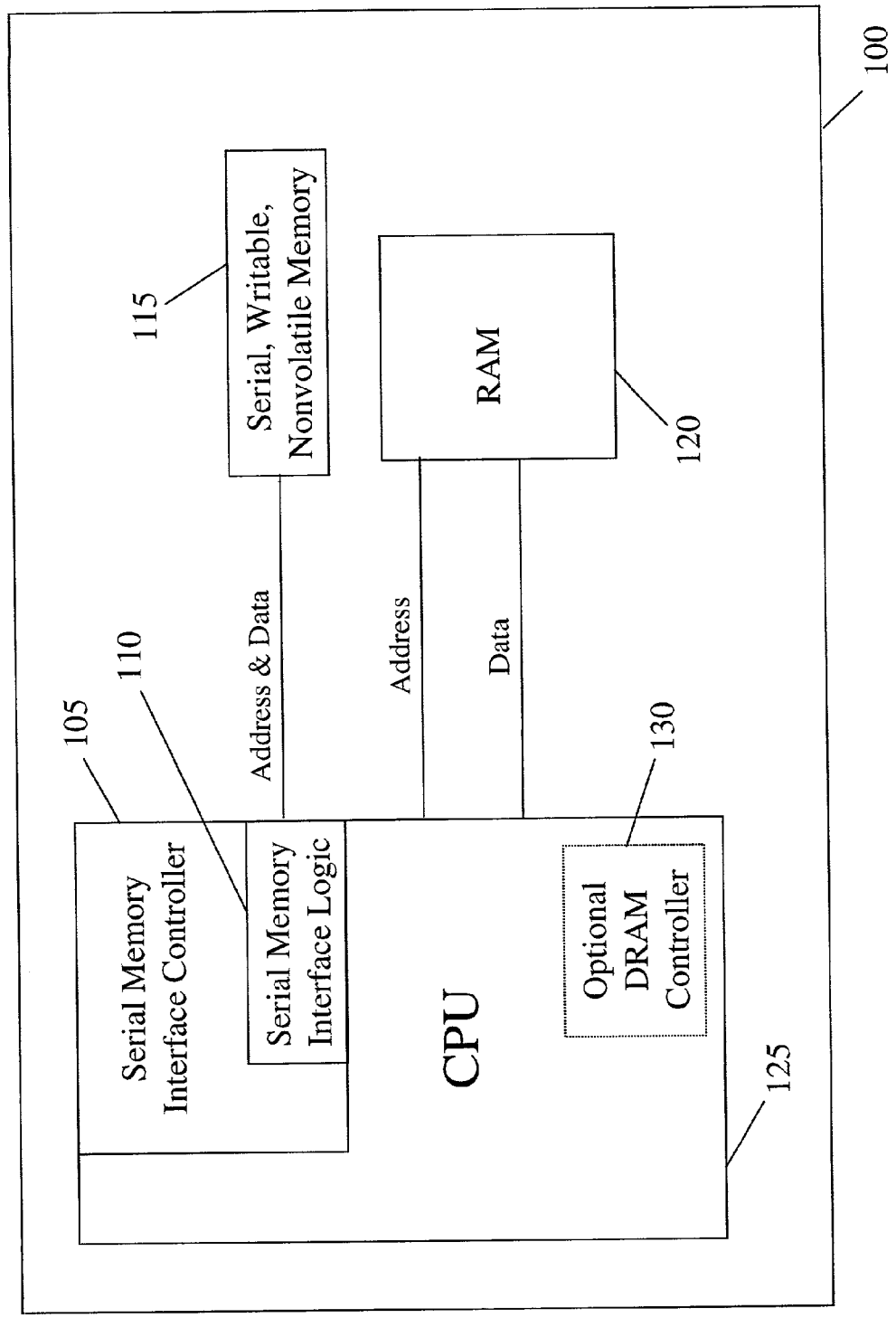
FIG. 1 shows an embodiment of the present invention, wherein the contents of serial memory are transferred to SDRAM via a dedicated onboard serial memory interface controller with serial memory logic.

FIG. 1 shows an embodiment of the present invention, wherein a cell phone 100 includes a serial memory interface controller 105 with embedded serial memory interface logic 110. In this embodiment, the serial memory interface controller 105 is implemented as dedicated hardware so that when the cell phone 100 is powered on, the serial memory interface controller 105 loads the data stored in serial memory 115 into random access memory (RAM) 120. In one embodiment, the RAM is synchronous dynamic random access memory (SDRAM). Serial memory may store data representing critical operations, including, but not limited to, an operating system, a program application and any calibration parameters that may be associated with the wireless communications device. In addition, serial memory may include less critical data including, but not limited to, phonebooks, recent call lists, display settings, roaming preferences, and ringer preferences.

Once the data stored in serial memory is loaded into RAM 120, the CPU 125 can execute program code and access data directly out of the RAM. As is well known in the art, DRAM needs to be refreshed thousands of times per second in order for it to maintain its contents, thus, in the embodiment in which RAM 120 is SDRAM, optional DRAM controller 130 is needed to manage the refresh of the SDRAM 120. In this embodiment, all of the data stored in serial memory is imaged to the SDRAM. However, it is contemplated that a paging system could be implemented wherein needed data is fetched from the serial memory as needed by the CPU. That is to say, when the CPU needs data that is not already loaded into RAM, or SDRAM, the CPU directs the serial memory interface controller to load the needed data from the serial memory into RAM.

Figure 2:
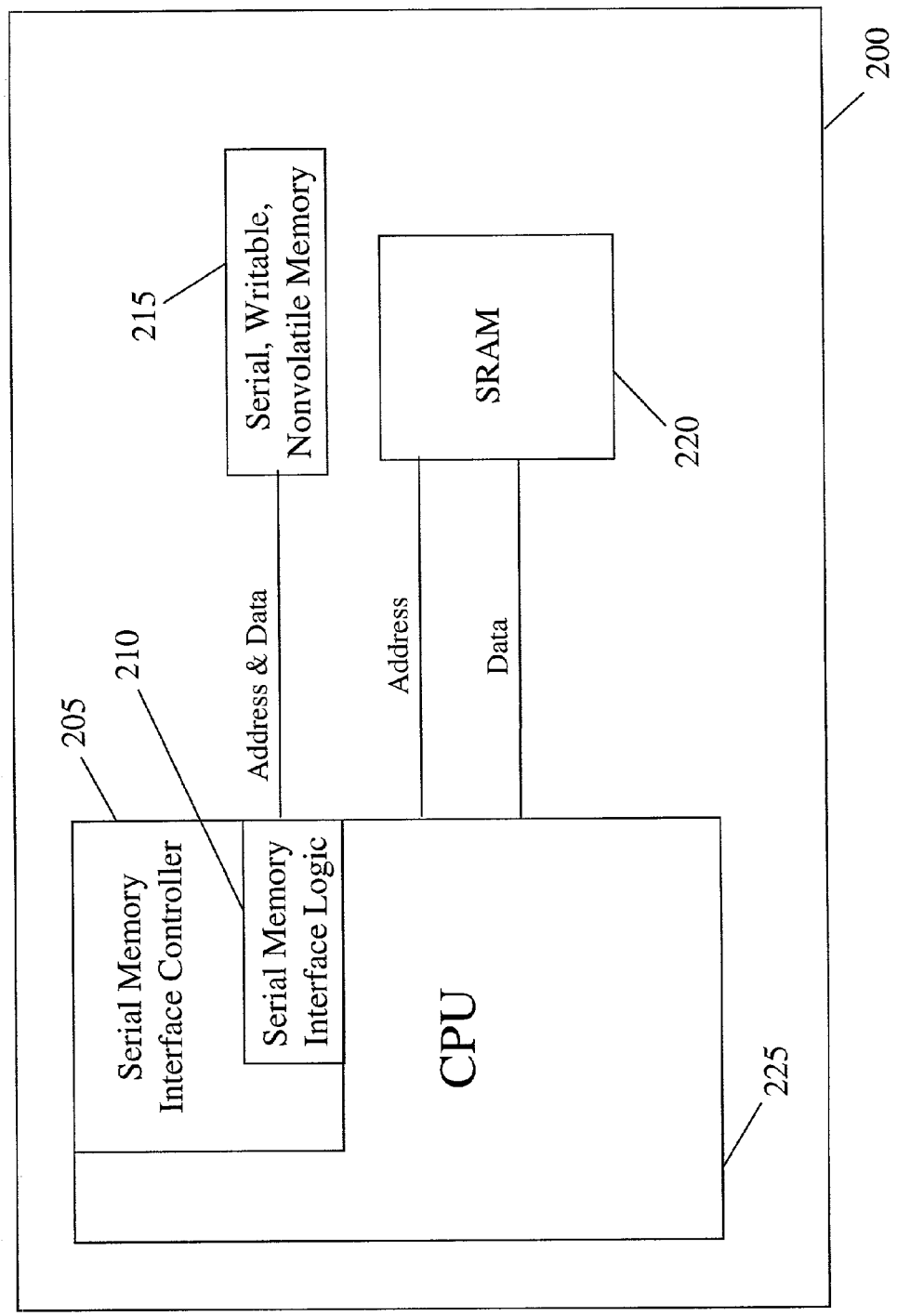
FIG. 2 shows an embodiment of the present invention, wherein the contents of serial memory are transferred to SRAM via a dedicated onboard serial memory interface controller with serial memory logic.

FIG. 2 shows another embodiment of the present invention, wherein a cell phone 200 includes a serial memory interface controller 205 with embedded serial memory interface logic 210. In this embodiment, the serial memory interface controller 205 is implemented as dedicated hardware so that when the cell phone 200 is powered on, the serial memory interface controller 205 begins to load the data stored in serial memory 215 into SRAM 220. Similarly to the serial memory 115 described with reference to FIG. 1, the serial memory 215 may store data representing critical operations including, but not limited to, an operating system, a program application and any calibration parameters that may be associated with the wireless communications device. In addition, serial memory may include less critical data including, but not limited to, phonebooks, recent calls lists, display settings, roaming preferences, and ringer preferences. Once the data is loaded into SRAM 220, the CPU 225 can execute program code and access data directly out of the SRAM. Unlike the previous embodiment, SRAM does not need to be refreshed in order to maintain its contents and thus an additional controller is not needed. In this embodiment, all of the data stored in serial memory is imaged to the SRAM. However, it is contemplated that a paging system could be implemented wherein needed information is fetched from the serial memory as needed by the CPU. That is to say, when the CPU needs an instruction, application or the like that is not already loaded into SRAM, the CPU could direct the serial memory interface controller to load the needed data from the serial memory into SRAM.

Figure 3:
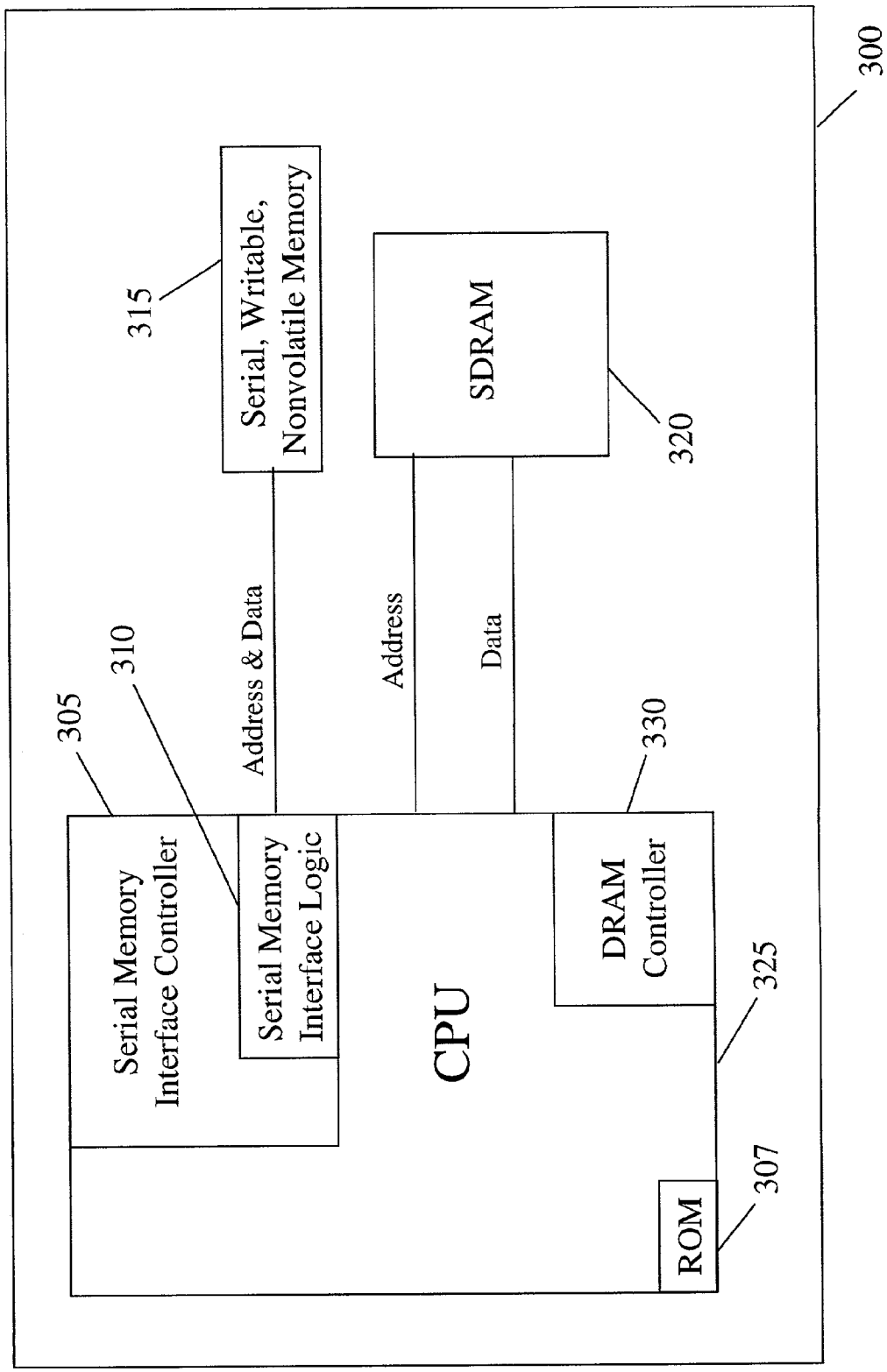
FIG. 3 shows an embodiment of the present invention, wherein the contents of serial memory are transferred to SDRAM via a dedicated onboard serial memory interface controller with serial memory logic after the CPU, executing code read from an onboard ROM determines the presence of serial memory.

Similarly to the serial memories 115 215 described with reference to FIG. 1 and FIG. 2 respectively, FIG. 3 shows another embodiment of the present invention, wherein a cell phone 300 includes a serial memory interface controller 305 with embedded serial memory interface logic 310. In this embodiment, the cell phone 300 also includes onboard ROM 307. The onboard ROM 307 contains boot code so when the cell phone 300 is powered on, the CPU, executing code read from the onboard ROM 307 will detect whether serial memory 315 is present. If the ROM 307 detects serial memory 315, the serial memory interface controller 305 is directed to load the data stored in serial memory 315 into SDRAM 320. According to this embodiment, if the CPU, executing code read from the onboard ROM 307, detects the presence of serial memory 315, all of the data stored in serial memory is imaged to the SDRAM. However, it is contemplated, as described above, that a paging system could be implemented wherein needed information is fetched from the serial memory as needed by the CPU.

Figure 4:
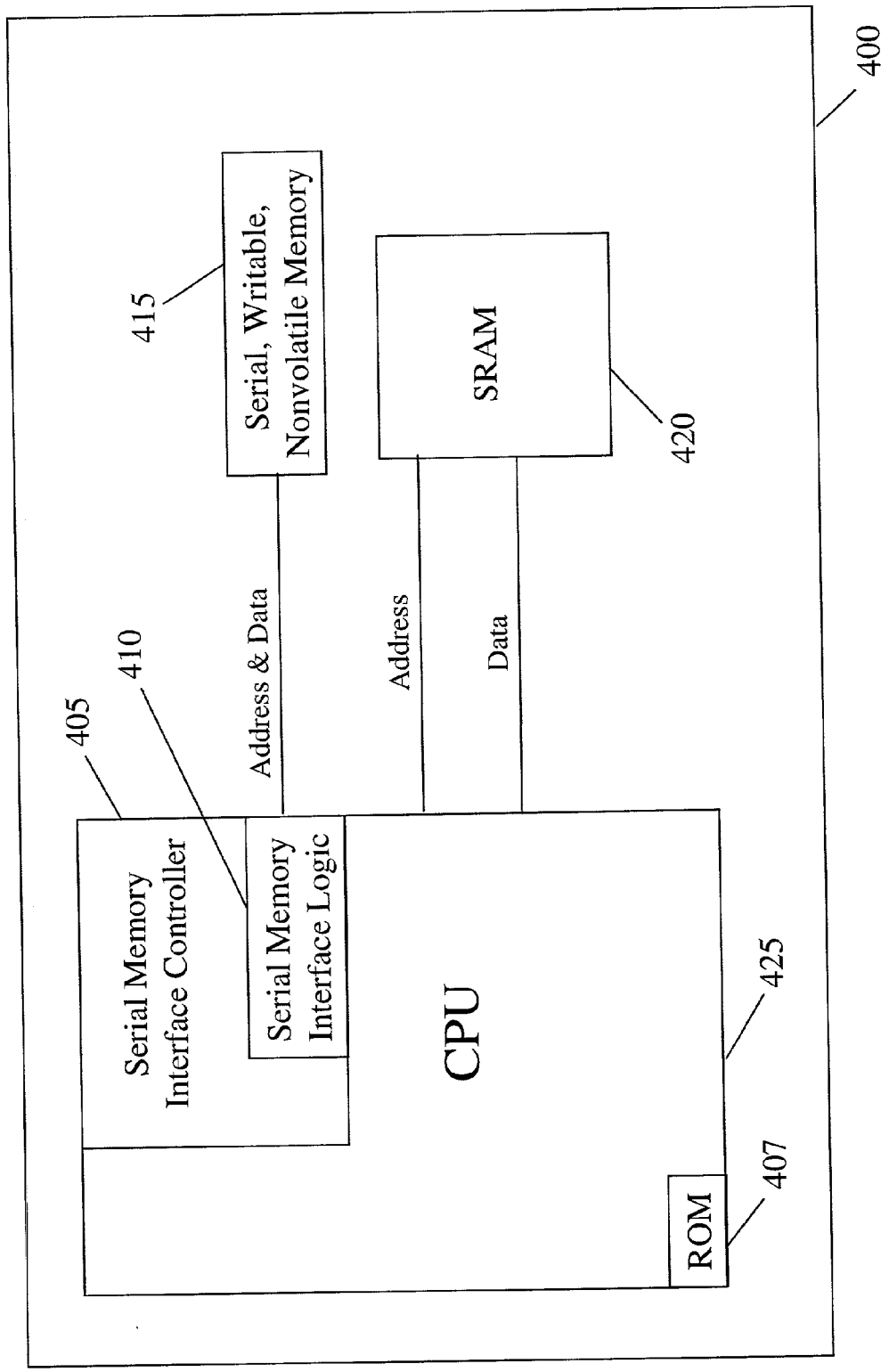
FIG. 4 shows an embodiment of the present invention, wherein the contents of serial memory are transferred to SRAM via a dedicated onboard serial memory interface controller with serial memory logic after onboard the CPU, executing code read from an ROM determines the presence of serial memory.

FIG. 4 shows another embodiment of the present invention, wherein a cell phone 400 includes a serial memory interface controller 405 with embedded serial memory interface logic 410. In this embodiment, the cell phone 400 also includes onboard ROM 407. The onboard ROM 407 contains boot code so when the cell phone 400 is powered on, the CPU executing code read from the onboard ROM 407 will detect whether serial memory 415 is present. If the ROM 407 detects serial memory 415, the serial memory interface controller 405 is directed to load the data stored in serial memory 415 into SRAM 420.

Figure 5:
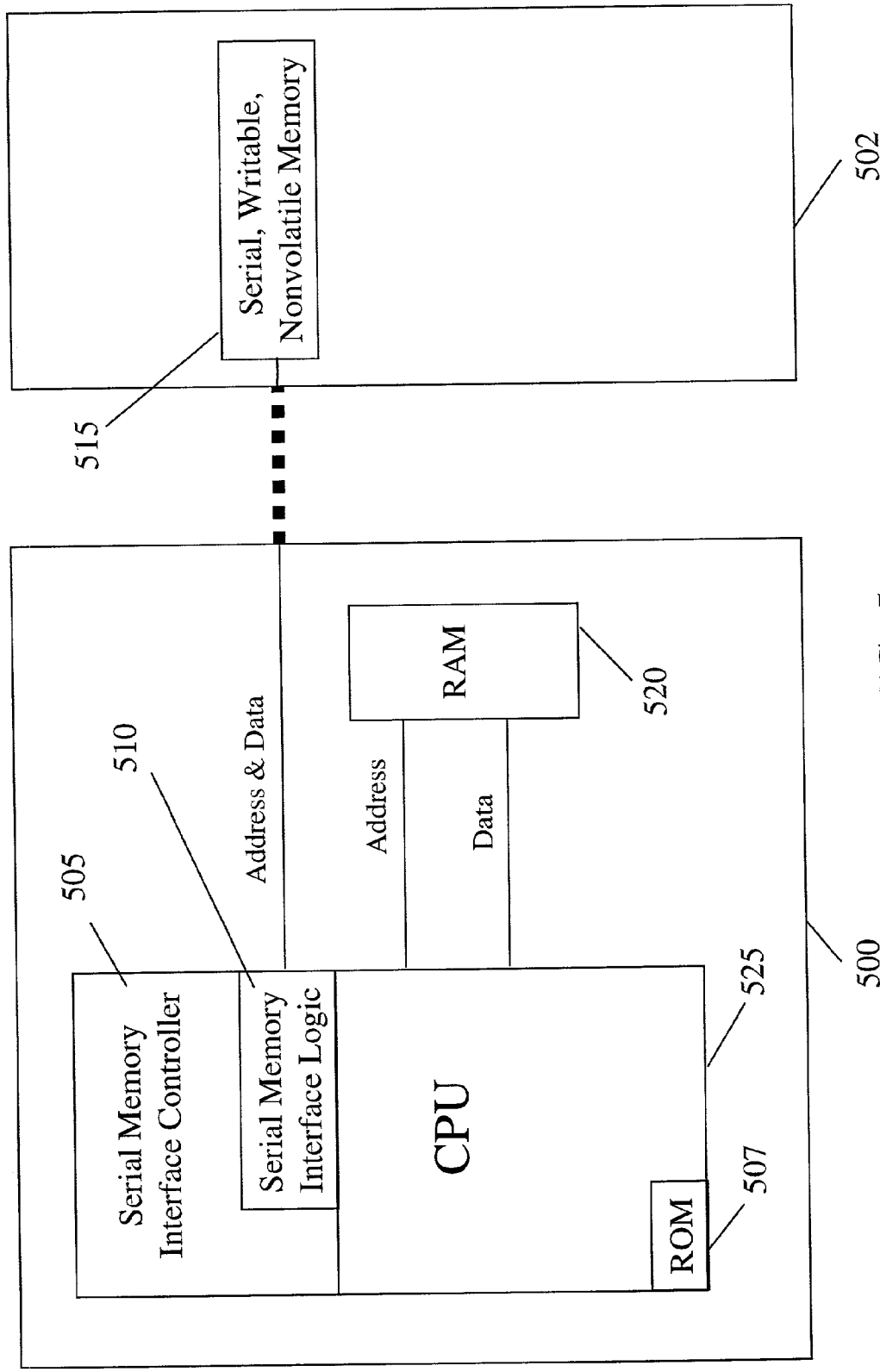
FIG. 5 shows an embodiment of the present invention, wherein serial memory included in a cell phone accessory is transferred to RAM located in a cell phone.

FIG. 5 shows a cell phone 500 and a cell phone accessory 502 that includes a serial memory 515. According to this embodiment, when the cell phone accessory 502 is attached to the cell phone 500, the contents of the serial memory 515 in the cell phone accessory 502 are loaded into onboard RAM 520 (i.e. SRAM or SDRAM), which is located in the cell phone 500. The cell phone CPU 525 can then execute program code or read data directly from the RAM 520.

By including the serial memory in the cell phone accessory, this embodiment provides a means in which completely new devices can be manufactured without the need for additional expensive microprocessors and associated program logic. For example, the cell phone accessory may be designed to connect to the cell phone to create a digital camera unit. In this example, the accessory includes the standard digital camera hardware (i.e. lens, flash, focus apparatus, etc), but does not need an additional CPU or additional program logic. The entire operating system, program applications, and program logic for the digital camera are stored in the serial memory. Upon connection of the accessory to the cell phone, the contents of the serial memory in the accessory are imaged to the onboard RAM in the cell phone thereby allowing the cell phone CPU to control and run the digital camera program code. Examples of other types of accessories include, but are not limited to, DVD players, personal digital assistants (PDAs), and video game consoles.

Figure 6:
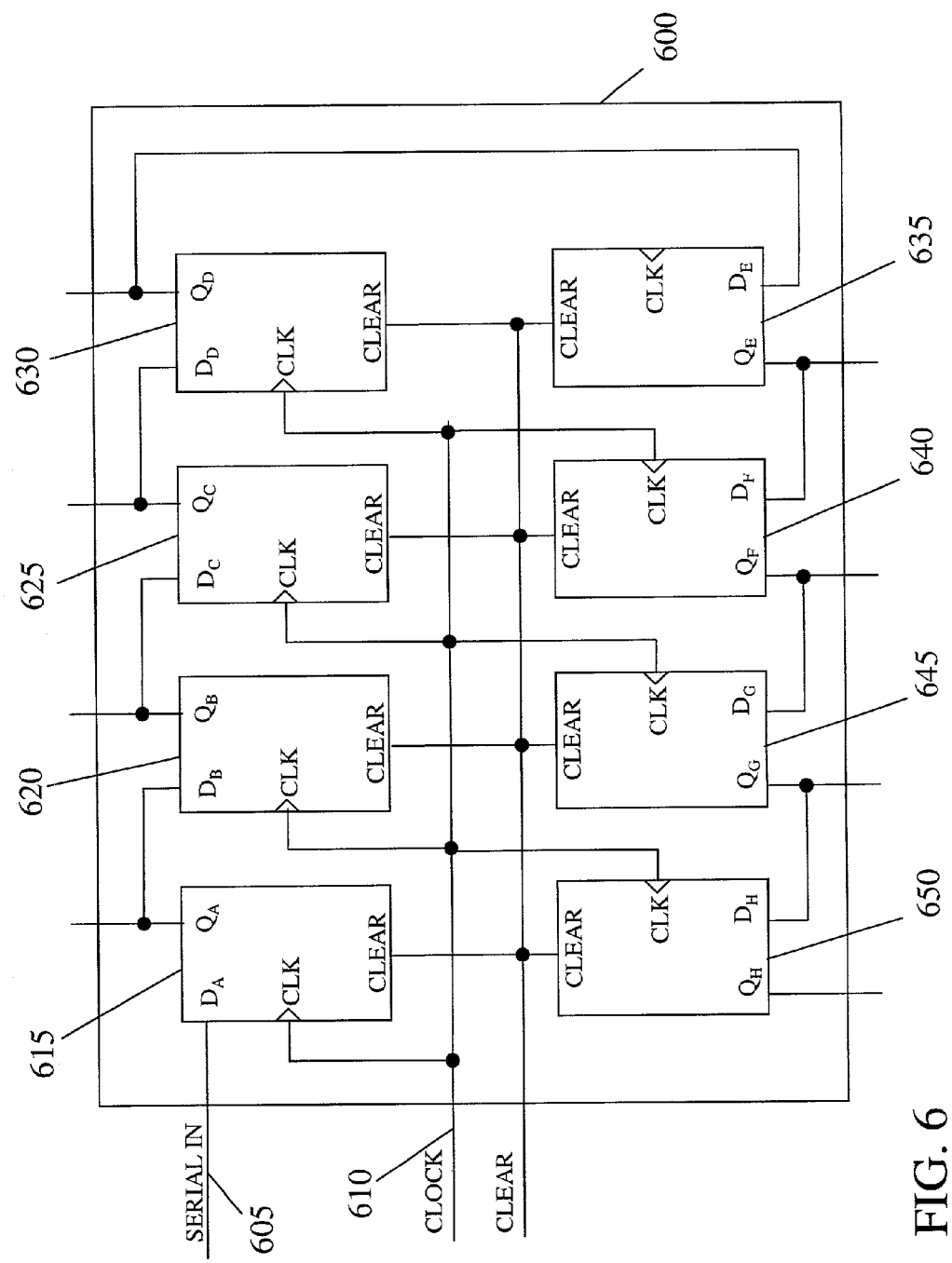
FIG. 6 shows, in part, an example of how the dedicated onboard serial memory interface controller with serial memory logic would operate to transfer the contents of serial memory to RAM.
Figure 7:
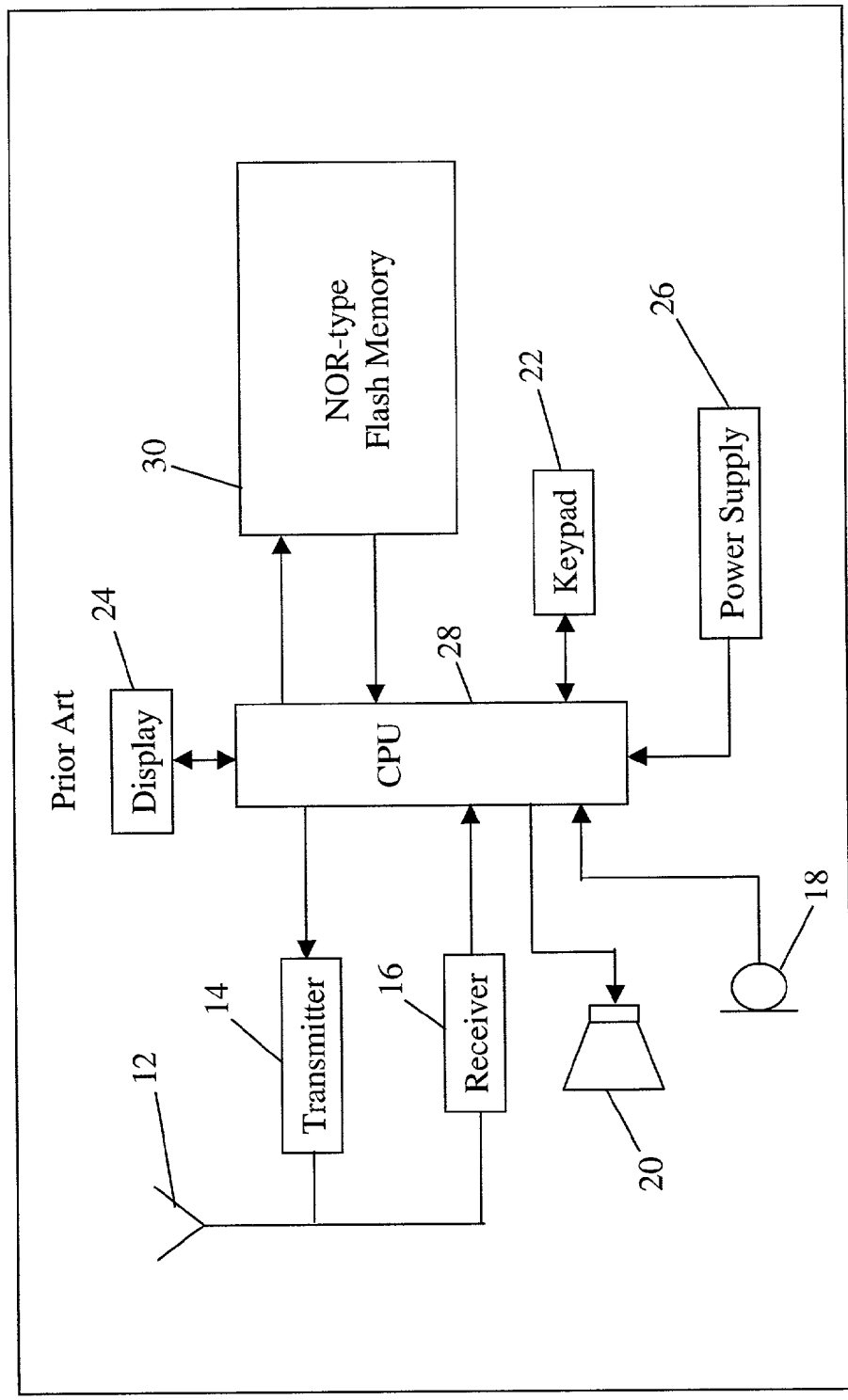
FIG. 7 shows a diagram of a conventional radio telephone.
Figure 8B:
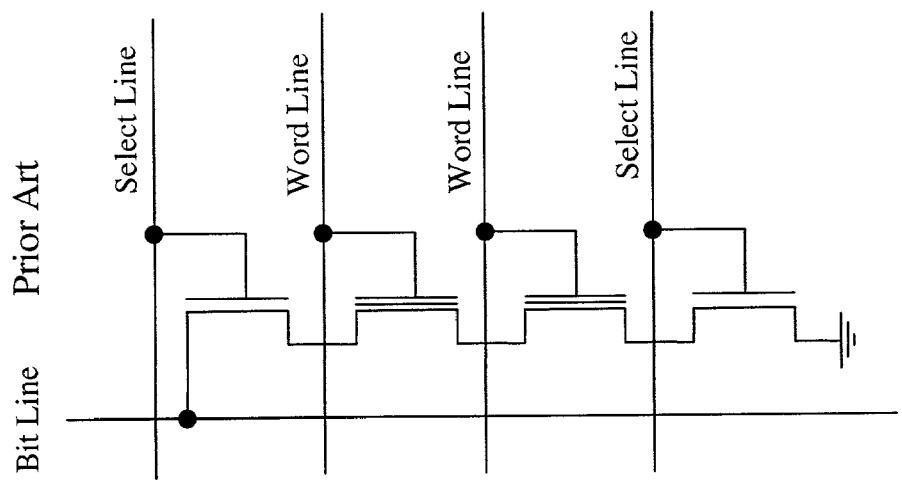
FIG. 8B shows a portion of a conventional NAND-type flash memory.
Figure 8A:
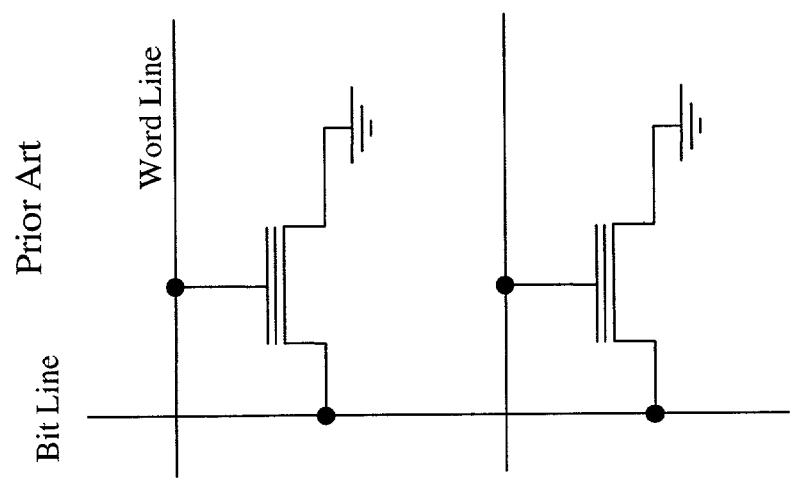
FIG. 8A shows a portion of a conventional NOR-type flash memory.

FIG. 6 shows, in part, an example of how a serial memory interface controller with embedded serial memory interface logic operates. As discussed earlier, serial memory typically utilizes a serial bus interface. RAM, however, typically has a parallel interface. Therefore, it is necessary to convert the serially read contents of nonintegral memory to a parallel structure so that the data can be written to RAM. Likewise, although not shown in this example, the serial interface controller with embedded serial memory interface logic must also be able to convert from parallel to serial so that new information can be written from RAM to serial memory.

One skilled in the art would recognize that there are numerous ways to perform the conversion from serial to parallel and parallel to serial. FIG. 6 merely provides one example of how the task of converting from serial to parallel can be accomplished. The basic configuration includes a shift register 600, a counter (not shown) and a comparator (not shown). The shift register 600 in this example is an 8 bit right-shift register, although other configurations are possible. In this example, the data stored in serial memory is sent one bit at a time (that is to say, one bit every clock cycle) to the serial in line 605. Each rising edge of the clock 610, the data present at the serial in line 605 is clocked into the first flip-flop 615. Simultaneously, whatever is in the first flip-flop 615 is latched into the second flip-flop 620 and whatever is in the second flip-flop 620 is latched into the third flip-flop 625 and so on through flip-flops 630, 635, 640, 645 and 650, respectively. Concurrently, with every clock pulse, a counter (not shown) is increased and the new counter value is sent to a comparator (not shown) to see if eight bits have been sent from the serial memory to the shift register 600. After eight bits have been sent to the shift register 600, the comparator will then send a write pulse to RAM and the eight bits in the shift register 600 will be simultaneously written to RAM. This process can be repeated as long as data needs to be transferred to the addressable memory.

It will be clear to one skilled in the art that configurations other than 8 bit right shift registers are possible. For example a 16 bit right shift register can be used. In this example the counter would count to 16, after 16 bits have been sent the comparator will send a write pulse to RAM. Additionally as stated above, it will be clear to those skilled in the art that the memory does not have to be a serial memory. A clocked memory that outputs more than 1 bit at a time can be used. A memory that outputs more than 1 bit at a time is known as a parallel memory. In one embodiment a clocked memory that outputs 8 bits is used. If the RAM is written to 8 bits at a time then a write pulse will be sent to the RAM for each 8 bits of data that is clocked out of the clocked memory. Other embodiments that use clocked memory are possible. For example an 8 bit wide clocked memory can be used to write 16 bits to RAM if the write pulse is sent to the RAM after two 8 bit words are clocked out of the clocked memory.

Additionally a memory that is addressable only one small portion at a time, referred to here as indexed addressable memory, can be used. By enabling the reading of one section of indexed addressable memory and reading that memory into the addressable memory and continuing the process until the desired information is stored in the addressable memory.

Other embodiments and uses of the invention will be apparent to those skilled in the art from consideration of the specification and practice of the invention disclosed herein. The specification and examples should be considered exemplary only, with the true scope and spirit of the invention being indicated by the following claims. As will be understood by those of ordinary skill in the art, variations and modifications of each of the disclosed embodiments, including combinations thereof, can be easily made within the scope of this invention as defined by the following claims.

What is claimed is:

1. A wireless communications device, comprising:
    a serially-addressed memory for storing data, the serially-addressed memory accessible by a serial address and data line;
    a processing unit directly connected to the serially-addressed memory by the serial address and data line, the processing unit having a serial memory interface for reading data from the serially-addressed memory upon a power on condition, the processing unit outputting at least a portion of the data read from the serially-addressed memory onto parallel address and data lines to a volatile memory;
    the volatile memory connected to the processing unit by the parallel address and data lines, the volatile memory for storing the at least a portion of the data read from the serially-addressed memory for later use by the processing unit;
    a communications circuit connected to the processing unit, the processing unit controlling the communications circuit utilizing the at least a portion of the data read from the volatile memory, the communications circuit comprising:
    a transmitter circuit;
    a receiver circuit; and
    an antenna connected to the transmitter circuit and the receiver circuit.

2. The wireless communications device of claim 1, wherein the serially-addressed memory is non-volatile serial memory.

3. The wireless communications device of claim 2, wherein the non-volatile serial memory is serial NAND flash memory.

4. The wireless communications device of claim 1, wherein the serially-addressed memory is clocked parallel memory.

5. The wireless communications device of claim 1, wherein the serially-addressed memory is indexed addressable memory.

6. The wireless communications device of claim 1, wherein the serially-addressed is removably connected to the processing unit by the serial address and data line.

7. The wireless communications device of claim 6, wherein the serially-addressed is non-volatile serial memory comprising at least one of a multi-media card, a smart media card, a secure digital card and a memory stick.

8. The wireless communications device of claim 1, wherein the volatile memory comprises at least one of a dynamic random access memory and a static random access memory.

9. The wireless communications device of claim 1, wherein the power on condition triggers the processing unit to determine whether the serially-addressed memory is connected to the processing unit, and to instruct the serial memory interface to transfer the at least a portion of the data from the serially-addressed memory to the volatile memory.

10. The wireless communications device of claim 1, wherein the at least a portion of the data stored in the serially-addressed memory is critical operations data.

11. The wireless communications device of claim 10, wherein the critical operations data is an application program that is critical to an operation of the wireless communications device.

12. The wireless communications device of claim 1, wherein the at least a portion of the data stored in the serially-addressed memory is non-critical operations data comprising at least one of user interface information, a recent call list, a display setting, a roaming preference, a ringer preference, a non-critical application program, and a phone book.

13. A method for managing a wireless communications device, comprising the steps of:
    executing instructions from a read-only memory in a processing unit, the instructions for directing a serial interface controller of the processing unit to read serial data from a non-volatile memory directly connected to the processing unit by a serial address and data line;
    reading the serial data from the non-volatile memory over the serial address and data line;
    converting the serial data to parallel data;
    transferring the parallel data to a volatile memory over parallel address and data lines;
    reading at least a portion of the transferred data from the volatile memory; and
    operating a communications circuit of the wireless communications device in response to the at least a portion of the transferred data.

14. The method of claim 13, wherein the non-volatile memory is a non-volatile serial memory.

15. The method of claim 14, wherein the non-volatile serial memory is serial NAND flash memory.

16. The method of claim 14, wherein the non-volatile memory is removable from the wireless communications device, further comprising the step of:
    connecting the removable non-volatile memory to the wireless communications device.

17. The method of claim 16, wherein the removable non-volatile memory is at least one of a multi-media card, a smart media card, a secure digital card and a memory stick.

18. A wireless communications device, comprising:
    a wireless communications circuit comprising:
    a receiver;
    a transmitter; and
    an antenna connected to the receiver and the transmitter;
    a serial non-volatile memory;
    a volatile memory; and
    a processor connected to the wireless communications circuit, the processor comprising:
    a serial interface controller directly connected to the serial non-volatile memory by a serial address and data line, and connected to the volatile memory by parallel address and data lines, the serial interface controller configured to read serial data from the serial non-volatile memory, to convert at least a portion of the serial data to parallel data, and to store the parallel data in the volatile memory; and a read only memory for storing read instructions, the read instructions for instructing the serial interface controller to read the serial non-volatile memory upon a boot up condition of the wireless communications device;

wherein the processor controls the wireless communications circuit based upon the stored parallel data in the volatile memory.

19. The wireless communications device of claim 18, wherein the serial non-volatile memory is removably connected to the serial interface controller.

20. The wireless communications device of claim 18, wherein the serial non-volatile memory is NAND flash memory.

* * * * *